United States Patent [19]

Rosenstock et al.

[11] Patent Number: 5,557,144
[45] Date of Patent: Sep. 17, 1996

[54] PLASTIC PACKAGES FOR MICROWAVE FREQUENCY APPLICATIONS

[75] Inventors: Michael A. Rosenstock, Branchburg; Phillip W. Wallace, Bernardsville; John T. Bayruns, Chatham; Kenneth S. Sanyigo, Fords; George G. Gilbert, Lebanon, all of N.J.

[73] Assignee: Anadigics, Inc., Warren, N.J.

[21] Appl. No.: 10,733

[22] Filed: Jan. 29, 1993

[51] Int. Cl.$^6$ .................................................. H01L 23/495
[52] U.S. Cl. .......................... 257/668; 257/664; 257/728; 333/246; 333/247
[58] Field of Search ............................ 257/666, 664, 257/691, 704, 728, 701, 702, 668, 676; 333/246, 247

[56] References Cited

U.S. PATENT DOCUMENTS

| | | | |
|---|---|---|---|
| 3,489,956 | 1/1970 | Yanai et al. | 257/664 |
| 3,628,105 | 12/1971 | Sakai et al. | 257/691 |
| 3,651,434 | 3/1972 | McGeough et al. | 257/664 |
| 4,369,330 | 1/1983 | Pilz | 257/704 |
| 4,441,119 | 4/1984 | Link | 257/666 |
| 4,680,613 | 7/1987 | Daniels et al. | 257/691 |
| 4,725,692 | 2/1988 | Ishii et al. | 174/52 |
| 4,751,611 | 6/1988 | Arai et al. | 361/421 |
| 4,777,520 | 10/1988 | Nambu et al. | 357/72 |
| 4,814,943 | 3/1989 | Okuaki | 361/400 |
| 4,832,996 | 5/1989 | Lesk et al. | 428/76 |
| 4,920,074 | 4/1990 | Shimizu et al. | 437/211 |
| 4,925,024 | 5/1990 | Ellenberger et al. | 206/328 |
| 5,045,820 | 9/1991 | Leicht et al. | 333/26 |
| 5,057,805 | 10/1991 | Kadowaki | 333/247 |
| 5,064,706 | 11/1991 | Ueda et al. | 428/131 |
| 5,072,283 | 12/1991 | Bolger | 257/676 |
| 5,152,057 | 10/1992 | Murphy | 29/883 |
| 5,155,579 | 10/1992 | Yeung | 357/81 |
| 5,162,896 | 11/1992 | Takubo et al. | 257/664 |
| 5,229,727 | 7/1993 | Clark et al. | 333/33 |
| 5,235,208 | 8/1993 | Katoh | 333/247 |
| 5,270,673 | 12/1993 | Fries et al. | 333/246 |
| 5,294,897 | 3/1994 | Notani et al. | 333/247 |

FOREIGN PATENT DOCUMENTS

| | | | |
|---|---|---|---|
| 419709 | 9/1989 | European Pat. Off. | |
| 57202759 | 12/1982 | Japan | 257/704 |
| 59031042 | 2/1984 | Japan | 333/247 |
| 02156702 | 6/1990 | Japan | 333/247 |
| 02148901 | 6/1990 | Japan | 333/247 |
| 05308207 | 11/1993 | Japan | 333/247 |

Primary Examiner—Sara W. Crane
Assistant Examiner—T. M. Arroyo
Attorney, Agent, or Firm—Pennie & Edmonds

[57] ABSTRACT

A plastic package for microwave applications up to 14 Ghz is disclosed. The plastic package includes a plastic platform, a lead frame embedded on the surface of the platform and, in one embodiment, a plastic cap mounted on the platform so as to seal the chip within the package. The lead frame includes a baseplate for mounting at least one semiconductor chip, at least one ground lead attached to the baseplate and extending outwardly therefrom, and at least one signal lead for conducting signals to or from such semiconductor chip. The signal lead and at least one ground lead are configured as a microwave transmission line such as microwave coplanar strips, or microwave coplanar waveguide for transmitting microwave frequency signals. The package offers a low inductance ground path, good thermal characteristics, and low parasitic inductance and capacitance. It can be applied for high speed and high frequency applications.

11 Claims, 8 Drawing Sheets

PLASTIC PACKAGES FOR MICROWAVE FREQUENCY APPLICATIONS

BACKGROUND OF THE INVENTION

The microelectronic revolution that began with the invention of transistors in the 1940s is now witnessing the incorporation of integrated circuits (ICs) into virtually every machine and appliance that people use daily, from cars and telephones to televisions and toasters. This large scale use of microprocessors in consumer electronics has been made possible in part by the development and manufacture of transfer molded plastic packages for ICs. Today, transfer molded plastic packages are used for more than ninety percent of all manufactured ICs and they continue to dominate the market for IC packages.

There are numerous advantages in using transfer molded plastic packages. They are small in size, easy to fabricate, can have large numbers of connecting leads, can be mass produced, and most importantly, can be made at low cost, typically only a few cents each in commercial quantities. This contrasts with costs of several dollars, typically, for higher performance packages, a cost which would prohibit the use of ICs in many consumer product applications.

A typical transfer molded plastic package consists of a lead frame, a semiconductor IC chip mounted on the lead frame, and an encapsulant enclosing the chip. The lead frame is the central supporting structure of the package. It normally consists of a baseplate for mounting the IC chip and many conductive strips (i.e. leads) extending outwardly from the baseplate. The lead frame is usually made by stamping or chemically milling a thin sheet of metal such as a copper alloy. Prior to encapsulation, the chip is electrically connected to the leads by connecting thin gold wires between the bonding pads of the chip and the leads. The chip, lead frame and wires are then encapsulated in a thermoplastic material, exposing only the outer ends of the leads for connection. Accordingly, the outer ends of the leads can be formed into various shapes for inserting into a printed circuit board or for surface mounting.

The above-described conventional transfer molded plastic packages are not suitable for high speed or high frequency operations such as those involving microwave frequencies. A microwave package requires low parasitic coupling between the input and output leads of the package, a low inductance ground path, a high degree of isolation of the chip, and the ability to dissipate heat generated by the chip. In conventional transfer molded plastic packages, the closely spaced leads generate coupling between the leads. Additionally, the encapsulant produces capacitive and resistive coupling between the input and output leads, and the capacitive coupling increases with increased operating frequency. Further, the encapsulant undesirably provides a parasitic capacitance between the leads and the chip, therefore reducing the electrical isolation of the chip, which is especially harmful for microwave circuit chips requiring high gain. Moreover, the encapsulant also loads the small spiral inductors normally used on a microwave circuit chip, thereby undesirably changing the properties of the microwave circuits. As a result, it precludes the use of such packages for complex multi-function microwave circuits.

Because conventional transfer molded plastic packages cannot be used for microwave circuits, other packages such as thin film or thick film ceramic packages are normally used. Compared with transfer molded plastic packages, ceramic packages are much more expensive to produce and are difficult to fabricate. Other alternative packages for microwave circuits such as commercially available TO-8 style packages are also much more expensive and generally cannot be surface mounted; they are therefore not suitable for applications that require surface mountable components.

Due to advances in microwave device and circuit technology, microwave circuits such as high performance GaAs Monolithic Microwave Integrated Circuits (MMICs) are being increasingly used in large numbers in applications such as cellular communications and Direct Broadcast Satellite (DBS) links. Some applications within these technologies have been foreclosed by lack of a commercially feasible low cost package for such circuits. Since the cost of GaAs microwave circuits has been drastically reduced in recent years due to the advancement of GaAs technology, the packaging cost of these circuits has increasingly become an important issue. Today, a packaged GaAs MMIC downconverter for satellite TV system costs only a few dollars or less; the cost of the package itself can significantly affect the cost of the packaged circuit and therefore the profitability and competitiveness of the product. By using lower cost packages, the cost of the packaged circuit can be greatly reduced. For example, by changing the package for a GaAs MMIC circuit from a ceramic leadless chip carrier package to a TO-5 package, the cost of the packaged circuit is reduced by 50 percent. However, TO-5 package is still much more expensive than the plastic packages. Accordingly, there has been a need, previously unmet, to provide a low cost, high performance, mass producible microwave package.

SUMMARY OF THE INVENTION

In accordance with the invention, a lead frame for a plastic package suitable for operation at microwave frequencies is disclosed. The lead frame comprises a baseplate for mounting at least one semiconductor chip, at least one ground lead attached to the baseplate and extending outwardly therefrom, and at least one signal lead for conducting signals to or from such semiconductor chip, said at least one signal lead and at least one ground lead being configured as a microwave transmission line.

More specifically, the signal lead and two ground leads may be configured as a microwave coplanar waveguide wherein the signal lead is disposed between two parallel ground leads, and the width of the signal lead, the width of each of the two parallel ground leads, the gaps between the signal leads and the parallel ground leads, and the gap between the signal lead and the baseplate are such that the resulting waveguide is suitable for transmitting microwave frequency signals. Alternatively, the signal lead and the ground lead can be configured as microwave coplanar strips wherein the signal lead is formed in parallel with the ground lead, and the width of the signal lead, the ground leads and the gap between the signal and ground leads are similarly such that the resulting waveguide is suitable for transmitting microwave frequency signals.

A transfer molded plastic package in accordance with the invention comprises a lead frame including a baseplate, at least one ground lead attached to the baseplate and extending outwardly therefrom, and at least one signal lead for conducting signals to or from such semiconductor chip, said at least one signal lead and at least one ground lead being configured as a microwave transmission line, the baseplate being capable of having at least one semiconductor chip adhesively mounted thereon, interconnecting means for connecting the signal lead to such chip, and a plastic encapsulant encasing such chip and the interconnecting means.

In another embodiment of the invention, a plastic package comprises a plastic platform, a lead frame formed on the platform, the lead frame having a baseplate for mounting at least one semiconductor chip thereon, and a plastic cap adhesively mounted on the plastic platform and the lead frame to enclose the chip therein. The lead frame may also comprise at least one ground lead attached to the baseplate and extending outwardly therefrom, and at least one signal lead for conducting signals to or from such semiconductor chip, said at least one signal lead and at least one ground lead being configured as a microwave transmission line.

Finally, a method for packaging a semiconductor chip is disclosed, comprising the steps of fabricating a lead frame including a baseplate and a plurality of leads, forming a plastic platform to embed the lead frame and to expose a top surface of the baseplate for mounting the chip, mounting the semiconductor chip on the baseplate, electrically connecting the chip with the leads, and mounting a plastic cap on the platform to seal the chip therein.

BRIEF DESCRIPTION OF THE DRAWINGS

These and other objects, features and advantages of the invention will be more apparent from the following detailed description in conjunction with the appended drawings in which.

DETAILED DESCRIPTION

Figure 1:
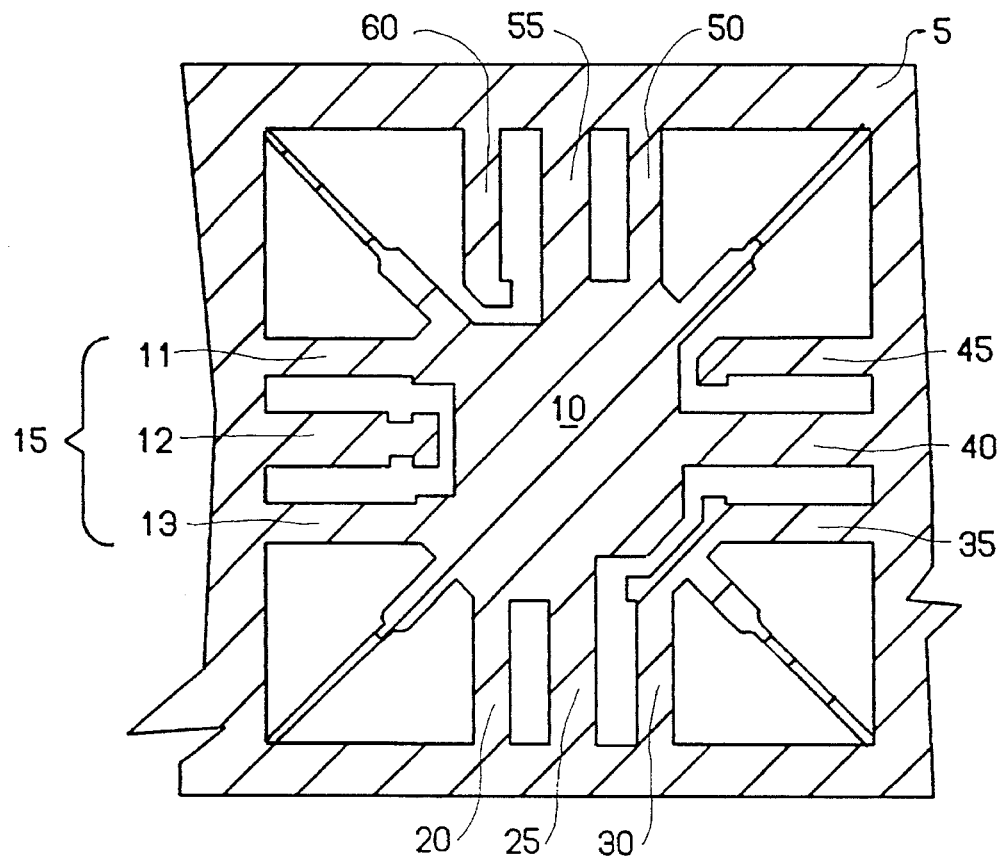
FIG. 1 is a top view of a preferred embodiment of a lead frame of the present invention.

In one preferred embodiment of the invention, as depicted in FIG. 1, a lead frame for a quad plastic package for microwave frequency operation comprises a baseplate 10 for mounting a semiconductor circuit chip with ground leads 11, 13, 20, 25, 40, 50 and 55 attached to the baseplate. A first coplanar waveguide 15 is shown for transmitting a first microwave signal to or from the semiconductor chip, as are an intermediate frequency lead 45 for transmitting an intermediate frequency to or from the chip, a dc voltage input lead 60, and two leads 30 and 35 for local oscillators. A periphery portion 5 connects to all the outer ends of the leads to hold the lead frame in place; it will be cut off from the lead frame after the package is formed.

Illustratively, first coplanar waveguide 15 comprises a signal lead 12 disposed between two parallel ground leads 11 and 13. In the waveguide, the two parallel ground leads 11 and 13 have the same width. The signal lead is symmetrically formed between the two parallel leads. Additionally, the width of the signal lead, the width of the two parallel ground leads, the spacings between the signal lead and the parallel leads, and the spacing between the baseplate and the signal lead, are designed to make the waveguide suitable for microwave frequency operation up to about 14 GHz. The design of microwave coplanar waveguides has been well known and has been described in numerous publications, for example, by K. C. Gupta in *Microstrip Lines and Slotines*, Chapter 7, Artech House, 1979.

Ground leads 11, 13, 20, 25, 40, 50 and 55 provide ground potential to the baseplate and the package. Illustratively, at least one ground lead extends outwardly from each of the four sides of this quad lead frame. This configuration advantageously provides a low inductance ground path to the baseplate. In addition, the ground leads efficiently dissipate heat generated from the chip mounted at the center of the baseplate. As a result, this lead frame provides low inductance ground path as well as good thermal characteristics.

Lead 45 is used for transmitting an intermediate frequency microwave signal. It is formed at the opposite side of the baseplate from the coplanar waveguide for minimizing any coupling between the intermediate frequency signals and those on the waveguide. Dc voltage lead 60 is used to provide a dc voltage to the lead frame. Local oscillator leads 30 and 35 are interconnected and they are used to connect the chip with an external oscillator. Preferably, to reduce coupling between the leads, the dc voltage lead, the intermediate frequency lead, the leads for local oscillator, and the signal lead of the waveguide are all separated from each other by at least one ground lead.

In this embodiment, the waveguide can be utilized for either importing a microwave signal to the chip, or for exporting a microwave signal from the chip. Similarly, the intermediate frequency lead can be used for either importing or exporting a signal of intermediate frequency from or to the chip. For example, if the semiconductor chip is a GaAs downconverter, a 12 GHz microwave signal is imported through the coplanar waveguide to the chip, and a 1 GHz intermediate frequency signal is provided from the chip to circuitry outside of the package through the intermediate frequency lead. Alternatively, the intermediate frequency lead may be used for importing a 1 GHz intermediate frequency signal, and a 12 GHz microwave signal may be exported from the waveguide.

The intermediate frequency lead in the above described lead frame can be replaced by a second coplanar microwave waveguide formed in the same fashion as the first coplanar waveguide. Such a lead frame is utilized when both the input signal to the chip and the output signal from the chip are microwave frequency signals.

In another alternative embodiment, microwave coplanar strips are used to transmit microwave signals to or from the chip. The microwave coplanar strips each comprise a signal lead formed parallel to a ground lead; the width of the signal and ground leads, as well as the gap between them, are made such that the resulting waveguide is suitable for microwave frequency operation.

Microwave coplanar strips and microwave coplanar waveguides may be used interchangeably, in accordance with the invention, and both types of waveguide may be used in the same package.

The above-described lead frame can also be utilized for high speed digital applications. For example, a high speed data stream can be transmitted to or from the chip via the coplanar waveguide or the coplanar strips.

One application of the above-described lead frame is in a transfer molded plastic package. In forming this package, a semiconductor chip is first mounted at the center of the baseplate with adhesives or solder. Electrical connections between the chip and the leads are formed by bonding gold wires from the leads to bonding pads on the chip. The chip, the baseplate, and the wires are then encapsulated by transfer molding of thermoplastic encapsulant. The total number of leads in this package can be made to be eight, twelve, sixteen or more to accommodate the applicable industry standard.

In another embodiment of this invention, a plastic package for a semiconductor chip comprises a lead frame formed on a plastic platform, and a plastic cap adhesively mounted over the lead frame and the platform to enclose the chip. As compared with conventional transfer molded plastic packages, this package provides reduced parasitic resistance and capacitance between input and output leads due to the absence of any encapsulant. Additionally, there is no dielectric loading effect on the chip. Therefore, this package is suitable for high speed or high frequency applications. Another advantage of this package over conventional transfer molded plastic packages is, because the plastic is not in direct contact with the chip, that the chip is free from encapsulant-induced stress due to the thermal expansion mismatch between the chip and the plastic.

Figure 2:
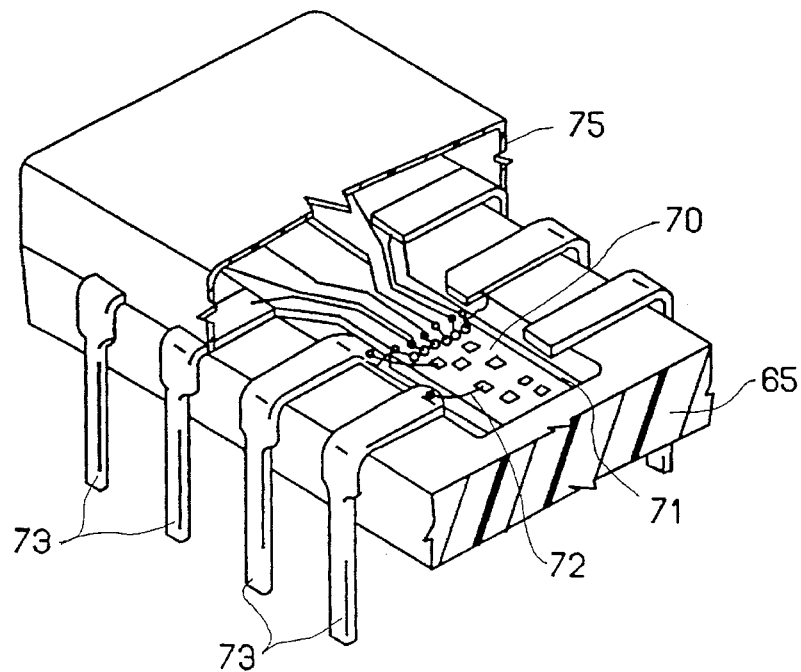
FIG. 2 is a three-dimensional view of one embodiment of the plastic package of the present invention.

FIG. 2 is a three-dimensional view of this package. The package comprises a plastic platform 65, a lead frame comprising baseplate 71 embedded in the platform and a plurality of leads 73, and a plastic cap 75 adhesively mounted on the platform. A semiconductor chip 70 is mounted on baseplate 71. Electrically conductive wires 72 such as gold or aluminum wires are bonded from the leads to the chip to provide electrical connection to the chip. Illustratively, the lead frame is a conventional lead frame; alternatively, a lead frame having leads configured as a microwave transmission line (such as the one depicted in FIG. 1) can be used in this package.

Figure 3A:
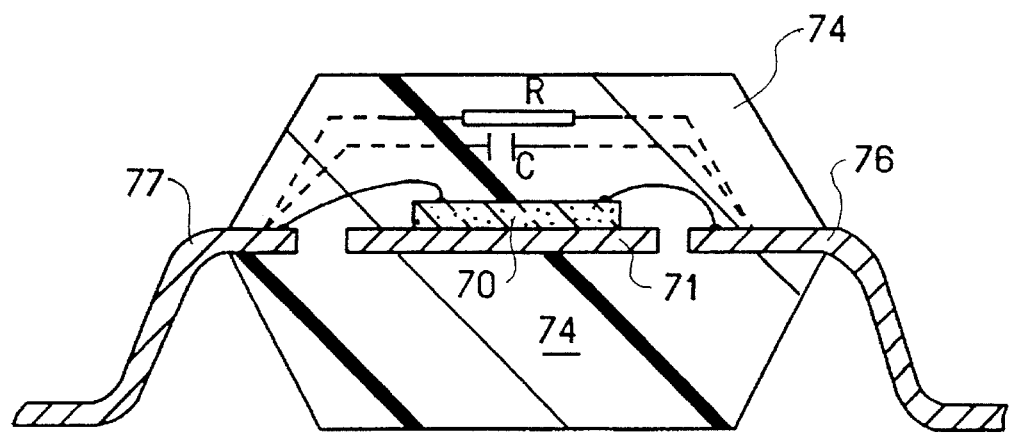
FIGS. 3a–c are cross-sectional views of a conventional transfer molded plastic package, the plastic package of the present invention, and an alternative embodiment of the package of the present invention, respectively.
Figure 3B:
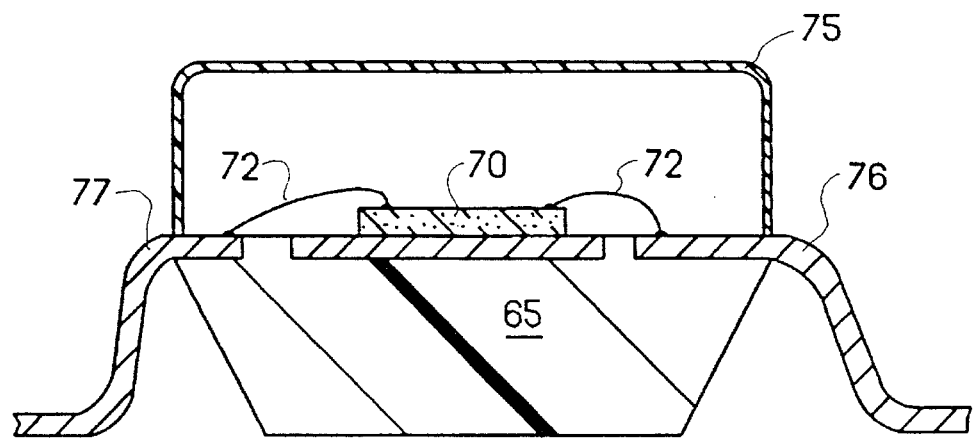

FIGS. 3a and b depict cross-sectional views respectively of a conventional transfer molded plastic package and a plastic package in accordance with the present invention, respectively. For convenience, like elements in this figure are given the same designations as in FIG. 2. As shown in FIG. 3a, in a conventional transfer molded plastic package, chip 70 is mounted on a baseplate 71 of a lead frame and is in direct contact with an encapsulant 74. Alternatively, a stress relieving material such as commercially available Dow Corning 6646 can be first applied to surround the chip prior to the encapsulation. In this case, the chip is in direct contact with the stress relieving material and not the encapsulant. Leads 76 and 77 transmit input signal lead and output signal lead, respectively. Capacitor C and resistor R represent parasitic capacitive and resistive coupling, respectively, between the input lead and output lead. As shown in FIG. 3b, the parasitic capacitor C and resistor R are essentially eliminated in the package of the present invention by the utilization of a plastic cap 75. As a result, the package of the present invention is suitable for high speed and high frequency applications.

Figure 3C:
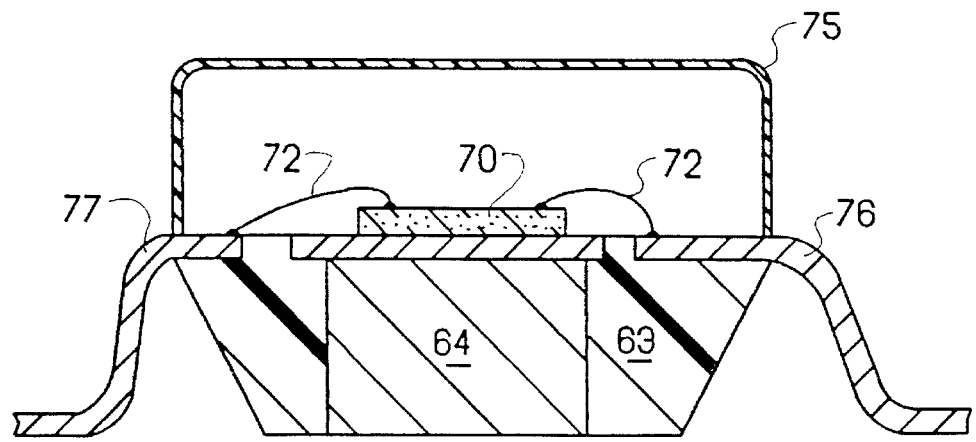

FIG. 3c illustrates an alternative embodiment of the package depicted in FIG. 3b. In this package, the platform comprises two components, a slug 64 formed substantially under and in contact with baseplate 71, and an annular plastic portion 63 surrounding the slug. Preferably, the slug is a metal slug and it functions as ground and a heat sink and it is especially useful when the chip is a high power chip. The slug can be soldered onto a circuit board when assembling this package.

FIGS. 4a–f depict a preferred embodiment of this plastic package. The package consists of three components, a lead frame 80, a thermoplastic platform 85, and a plastic cap 90 adhesively mounted on the lead frame. The outer dimensions of this package are substantially similar to the industrial standard Small Quad Flat Package (SQFP); thus this package can conveniently replace the SQFP.

Figure 4A:
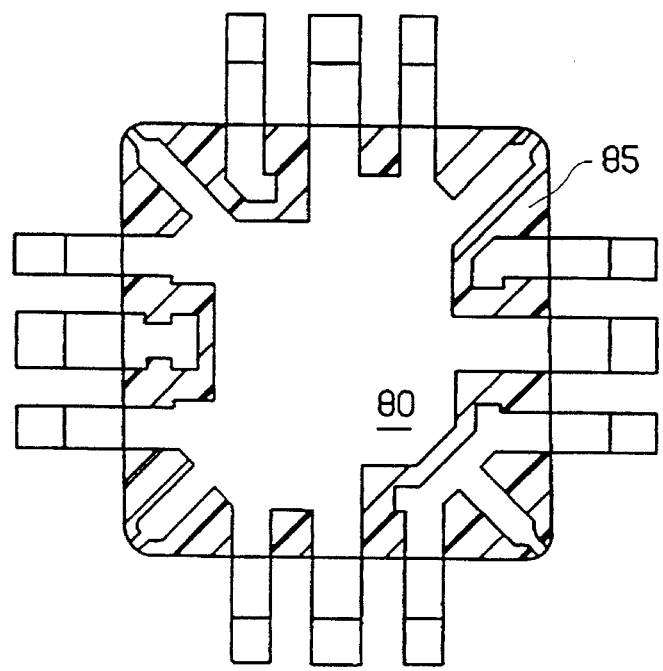
FIGS. 4a–f depict top and side views of the lead frame molded on a plastic platform, top and side views of a plastic cap, and top and side views of a preferred embodiment of the plastic package of this invention.
Figure 4B:
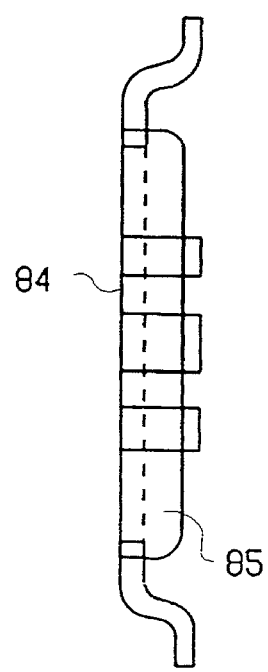

The top and side views of the lead frame molded onto the plastic platform are illustrated in FIGS. 4a and b. The lead frame is the same lead frame as illustrated in FIG. 1, and thus is not described in detail here. The lead frame is molded onto thermoplastic platform 85. The outer ends of the leads from the lead frame may advantageously be bent to form gull-wing shaped ends for surface mounting as shown in FIG. 4b. A semiconductor chip such as a GaAs downconverter can be adhesively mounted at the center and on a top surface 84 of the lead frame; and the chip is electrically connected with the lead frame by wire bonding between the bonding pad on the chip and the portions of the leads that are closest to the baseplate.

Figure 4C:
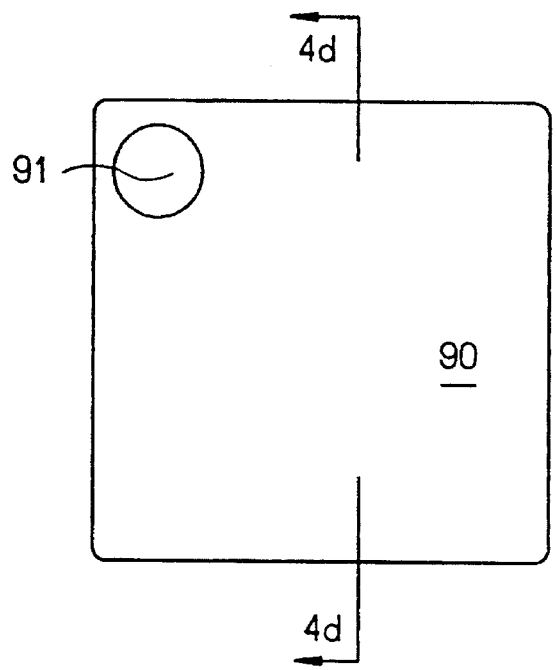
Figure 4D:
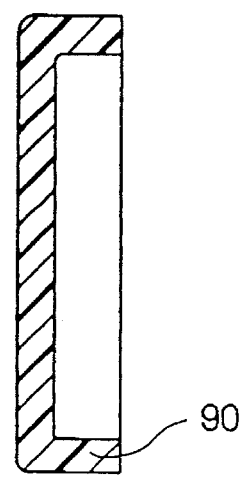
Figure 4E:
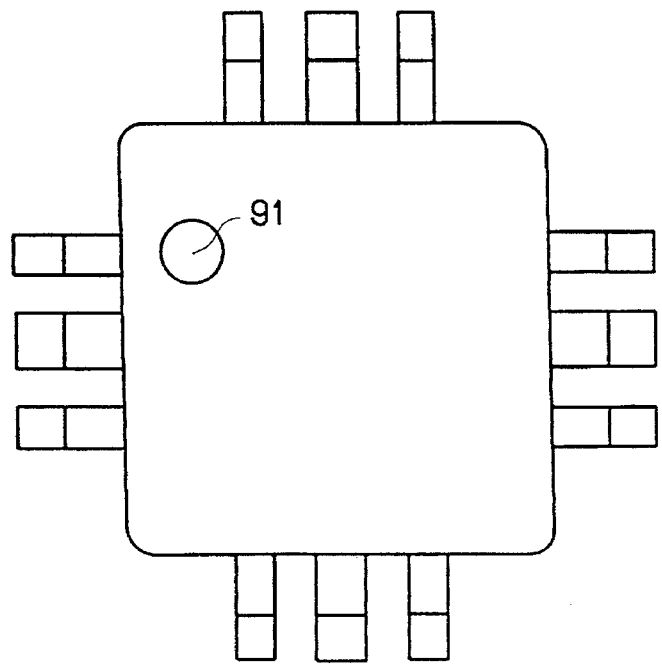
Figure 4F:
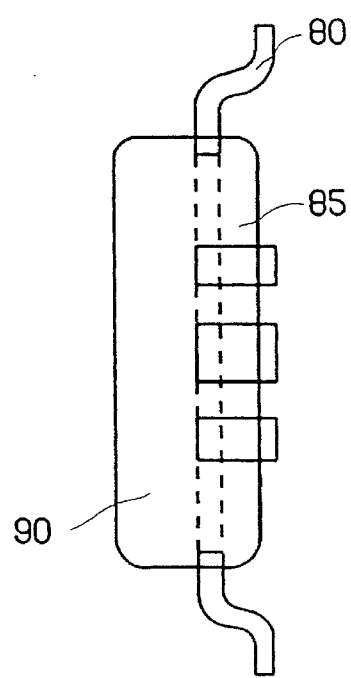

The top and cross-sectional views of the plastic cap are depicted in FIGS. 4c and d. A circular dent 91 formed at the outer surface of the cap is an index feature for package assembly. An index feature can also be formed on the lead frame for identifying the leads.

Figure 4G:
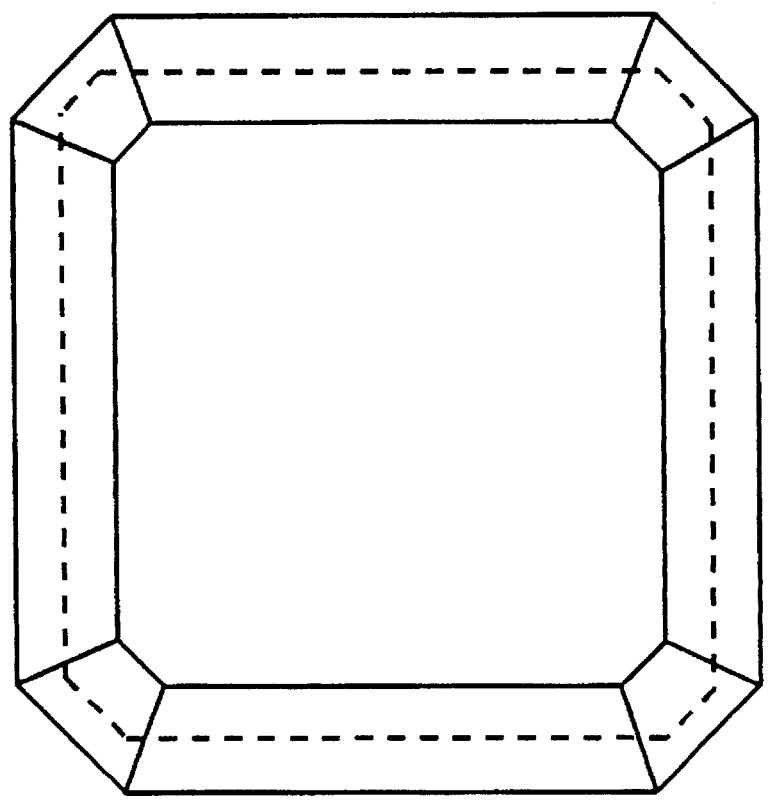
FIGS. 4g and h depict top and cross-sectional views of a plastic cap with chamfered exterior.
Figure 4H:
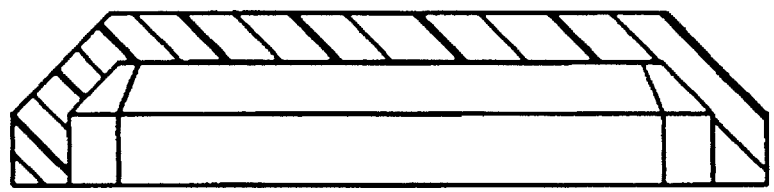

As depicted in FIGS. 4g and h, a cap has chamfered exterior can be utilized in the package. Chamfered cap prevents cracks at the corners of the cap and reduces manufacturing difficulties.

In this package, both the platform and the cap are made of conventional Novolac thermoplastic. The lead frame may be made of any copper alloy such as the one conventionally designated as OLIN. This material provides good thermal and electrical conductivities.

The plastic package of the invention may be fabricated utilizing well developed packaging technology. First, The lead frame is made by appropriate chemical milling of a thin sheet of copper alloy such as OLIN. Alternatively, the lead frame can also be manufactured by stamping from a sheet of copper alloy. The fabricated lead frame is then transferred to a transfer-molding press for forming the plastic platform on the lead frame.

A semiconductor chip is then mounted approximately at the center of the baseplate of the lead frame by conductive epoxy such as silver filled epoxy or solder. Wire bonding is subsequently performed to connect the chip to the leads. Finally, the plastic cap is adhesively mounted on the plastic platform, sealing the chip in the cavity formed between the cap and the platform.

The package of the invention displays excellent microwave frequency characteristics and thermal characteristics. Microwave frequency operation up to 14 GHz, and maximum power up to 1 W have been achieved with a GaAs downconverter enclosed in the package. These values are not intended as limits on the scope of the invention.

Figure 5:
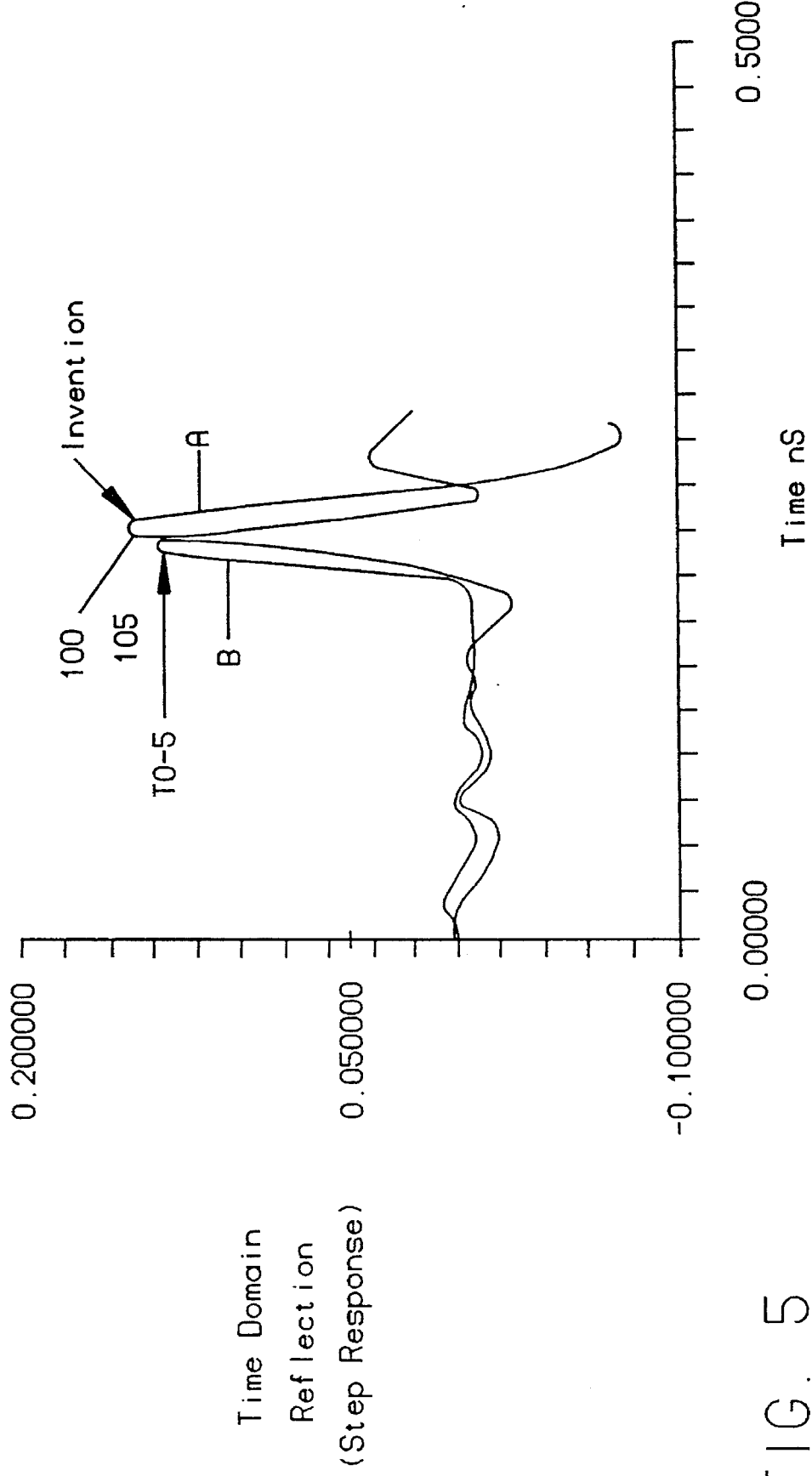
FIG. 5 illustrates a measured time domain reflection versus time for a GaAs coplanar transmission line mounted in a plastic package of the present invention, and in a conventional TO-5 package.

In FIG. 5, the frequency response of this package is measured and compared with the frequency response of a conventional TO-5 ceramic package for microwave application. In this experiment, a fast rising pulse is transmitted to the package that contains a GaAs coplanar transmission line which is terminated, and the reflection of the pulse is measured against time from the starting of the pulse. In this figure, y axis represents the time domain reflection (or step response) and the x-axis the time. Curve A in the figure is the measured reflection of a GaAs coplanar transmission line mounted in the quad plastic package illustrated in FIGS. 4a–f. For comparison, the measured reflection of the same kind of GaAs coplanar transmission line mounted in a conventional TO-5 package is shown in the same drawing as curve B. Peaks 100 and 105 in the drawing reflect the amplitudes of the parasitics of the plastic package of the invention and the TO-5 package, respectively. As shown, the parasitics of the plastic package and the much more expensive TO-5 package are comparable, showing that the former is suitable for microwave applications.

Figure 6:
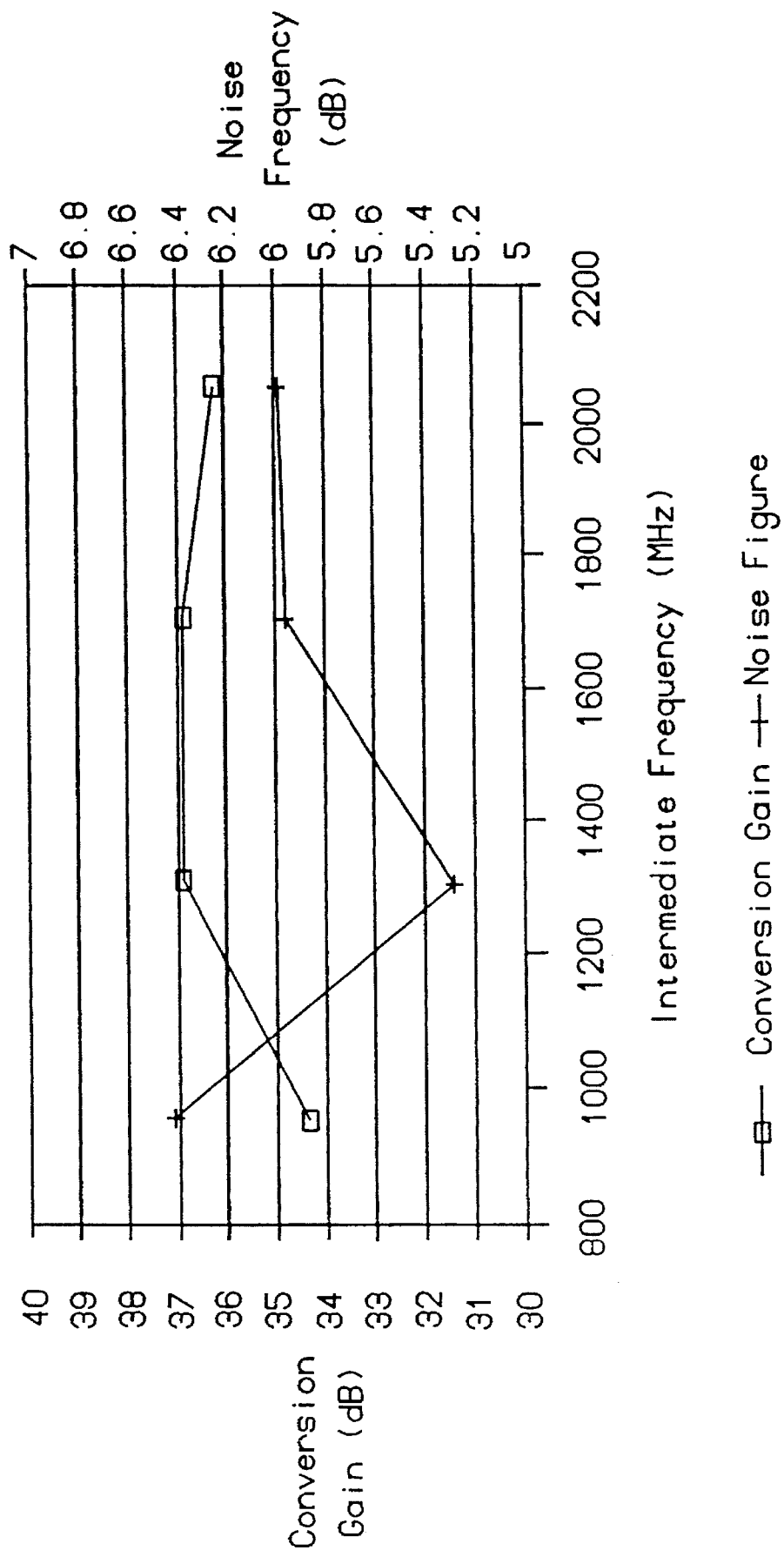
FIG. 6 displays the measured conversion gain and noise figure versus frequency for a Ku-band GaAs downconverter mounted in a plastic package of the present invention.

FIG. 6 shows the measured Conversion Gain and Noise Figure (in dB) versus intermediate frequency (in MHz), respectively, for a Ku-Band downconverter for Direct Broadcast Satellite mounted in a quad plastic package in accordance with the invention. The RF frequency for this test is approximately between 10.7 and 11.8 GHz, and the local oscillator frequency is 9.75 GHz. The high conversion gain and low noise figure demonstrate the excellent microwave frequency characteristics of the plastic package.

The above-described preferred embodiment has twelve leads. Alternatively, a plastic package having eight, sixteen, more than sixteen, or any desired number of leads can also be similarly constructed. Packages having eight leads generally include one central signal lead and two ground leads for the coplanar waveguide, one lead for dc input, one lead for local oscillator, and one intermediate frequency lead. For the package with sixteen leads, the leads ordinarily consist of one central signal lead and two ground leads for the coplanar waveguide, one intermediate frequency lead, two leads for local oscillator, one lead for dc voltage input, and nine other ground leads.

As will be apparent to those skilled in the art, numerous modifications may be made within the scope of the invention, which is not intended to be limited except in accordance with the following claims.

What is claimed is:

1. A plastic package comprising:

a plastic platform;

a metallic lead frame having a plurality of leads and a baseplate, the baseplate being embedded in the plastic platform and having an exposed top surface substantially level with a top surface of the platform for mounting at least one semiconductor chip, at least some of the plurality of leads having a first portion disposed on the platform and a second portion, connected to the first portion, extending outside the platform at substantially the same level as the first portion; and a plastic cap mounted on the platform and covering at least parts of the first portions of the leads to enclose and seal the chip therein.

2. The package of claim 1 wherein the at least some of the plurality of leads comprise at least one ground lead attached to the baseplate and extending outwardly therefrom, and at least one signal lead for conducting signals to or from such semiconductor chip, the at least one signal lead and the at least one ground lead being configured as a microwave transmission line.

3. The package of claim 1 wherein the cap has a chamfered exterior.

4. The package of claim 2 wherein the signal lead and the ground lead are configured as microwave coplanar strips wherein the signal lead is formed parallel to the ground lead, and the widths of the signal lead, the ground leads and the gaps between the signal and ground leads are such that the leads form a waveguide suitable for transmitting microwave frequency signals.

5. The package of claim 2 wherein the signal lead and two parallel ground leads are configured as a microwave coplanar waveguide wherein the signal lead is disposed between two parallel ground leads, and the width of the signal lead, the width of each of the two parallel ground leads, the gaps between the signal lead and the parallel ground leads, and the gap between the signal lead and the baseplate are such that the leads form a waveguide suitable for transmitting microwave frequency signals.

6. The package of claim 5 further comprising an intermediate frequency signal lead for transmitting intermediate frequency signals to and from the chip.

7. The package of claim 6 wherein the coplanar waveguide and intermediate frequency lead extend out from two opposite sides of the baseplate for reducing coupling therebetween.

8. The package of claim 7 wherein the lead frame is made of a copper alloy.

9. The package of claim 8 wherein the total number of leads is eight.

10. The package of claim 7 wherein the total number of leads is twelve, consisting of one signal lead and two ground leads for the waveguide, one intermediate frequency lead, two leads for local oscillator signal, one lead for dc voltage input, and five additional ground leads.

11. The package of claim 7 wherein the total number of leads is 16.

* * * * *